United States Patent
Park et al.

(10) Patent No.: US 11,177,170 B2
(45) Date of Patent: Nov. 16, 2021

(54) REMOVAL OF BARRIER AND LINER LAYERS FROM A BOTTOM OF A VIA

(71) Applicant: International Business Machines Corporation, Armonk, NY (US)

(72) Inventors: Chanro Park, Clifton Park, NY (US); Koichi Motoyama, Clifton Park, NY (US); Kenneth Chun Kuen Cheng, Albany, NY (US); Nicholas Anthony Lanzillo, Wynantskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/744,984

(22) Filed: Jan. 16, 2020

(65) Prior Publication Data
US 2021/0225702 A1 Jul. 22, 2021

(51) Int. Cl.
*H01L 21/768* (2006.01)

(52) U.S. Cl.
CPC .. *H01L 21/76865* (2013.01); *H01L 21/76816* (2013.01); *H01L 21/76831* (2013.01); *H01L 21/76843* (2013.01); *H01L 21/76877* (2013.01)

(58) Field of Classification Search
CPC .......... H01L 23/5226; H01L 21/76877; H01L 21/76843; H01L 21/76865; H01L 21/76816
See application file for complete search history.

(56) References Cited

U.S. PATENT DOCUMENTS

| | | | |
|---|---|---|---|
| 5,693,563 A | 12/1997 | Teong | |
| 6,284,657 B1 * | 9/2001 | Chooi | H01L 21/76801 257/E21.576 |
| 6,291,334 B1 | 9/2001 | Somekh | |
| 6,303,486 B1 | 10/2001 | Park | |
| 6,340,435 B1 | 1/2002 | Bjorkman et al. | |
| 6,355,555 B1 | 3/2002 | Park | |
| 6,372,636 B1 * | 4/2002 | Chooi | H01L 21/76807 257/E21.579 |
| 6,424,044 B1 | 7/2002 | Han et al. | |
| 7,915,166 B1 * | 3/2011 | Yu | H01L 21/76849 438/687 |

(Continued)

FOREIGN PATENT DOCUMENTS

WO 99/33102 A1 7/1999

*Primary Examiner* — Zandra V Smith
*Assistant Examiner* — John M Parker
(74) *Attorney, Agent, or Firm* — Abdy Raissinia; Ryan, Mason & Lewis, LLP

(57) ABSTRACT

A method for manufacturing a semiconductor device includes forming an interconnect in a first dielectric layer, and forming a second dielectric layer on the first dielectric layer. In the method, an etch stop layer is formed on the second dielectric layer, and a third dielectric layer is formed on the etch stop layer. A trench and an opening are formed in the third and second dielectric layers, respectively. A barrier layer is deposited in the trench and in the opening, and on a top surface of the interconnect. The method also includes removing the barrier layer from the top surface of the interconnect and from a bottom surface of the trench, and depositing a conductive fill layer in the trench and in the opening, and on the interconnect. A bottom surface of the trench includes the etch stop layer.

20 Claims, 16 Drawing Sheets

(56) References Cited

U.S. PATENT DOCUMENTS

| | | | |
|---|---|---|---|
| 8,124,522 B1* | 2/2012 | Wu | H01L 23/53295 |
| | | | 438/618 |
| 8,174,122 B2* | 5/2012 | Amano | H01L 23/53233 |
| | | | 257/762 |
| 9,530,788 B2 | 12/2016 | Oginoe et al. | |
| 9,659,864 B2 | 5/2017 | Wu et al. | |
| 2002/0098673 A1* | 7/2002 | Yeh | H01L 21/76831 |
| | | | 438/618 |
| 2007/0238279 A1* | 10/2007 | Cerio, Jr. | H01L 21/76843 |
| | | | 438/597 |
| 2018/0061707 A1 | 3/2018 | Clevenger et al. | |
| 2019/0067087 A1 | 2/2019 | Briggs et al. | |

* cited by examiner

200

200

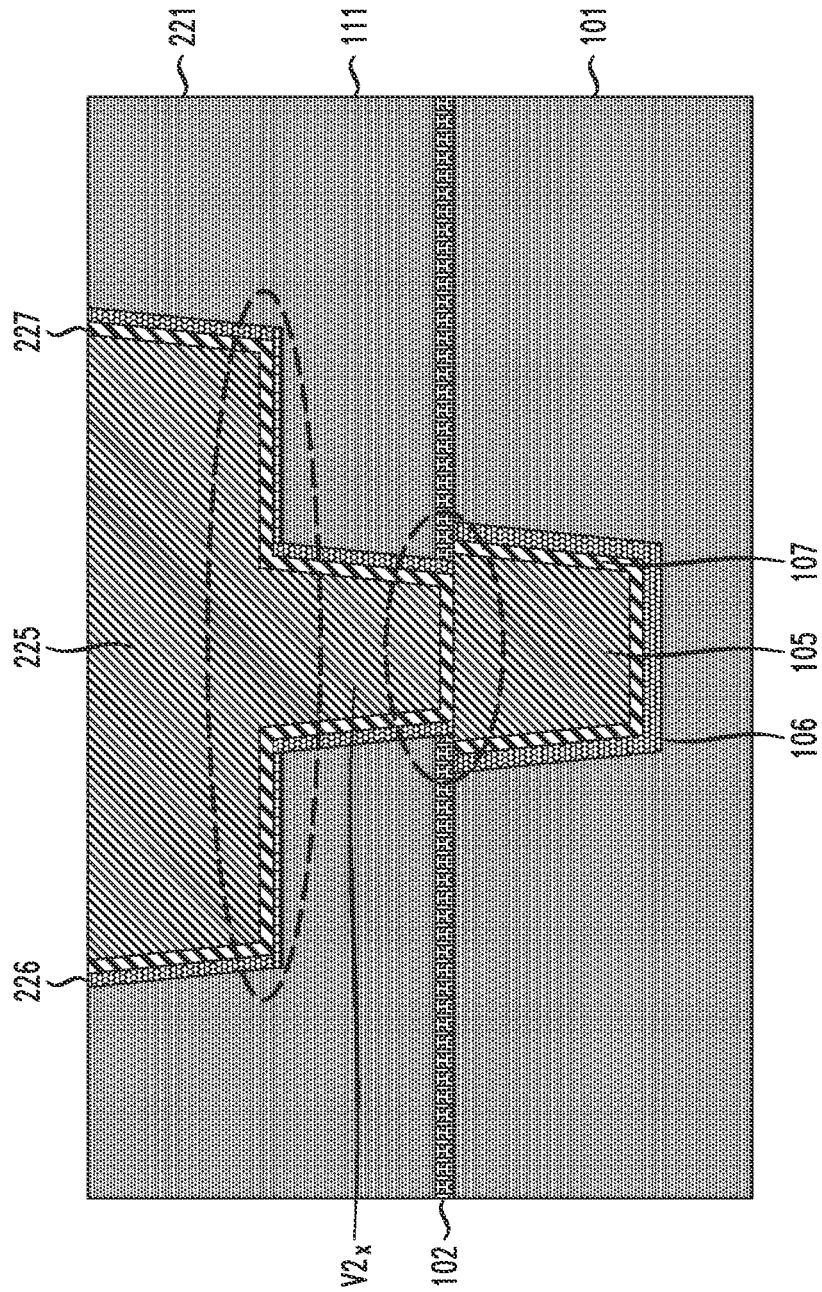

REMOVAL OF BARRIER AND LINER LAYERS FROM A BOTTOM OF A VIA

BACKGROUND

Barrier and liner materials in vias cause high resistances in, for example, middle-of-line (MOL) and back-end-of-line (BEOL) structures. Etch-back processes to remove barrier and liner materials from a bottom portion of a via opening cause unwanted removal of the barrier and liner materials from bottom portions of conductive line trenches. This unwanted removal of the barrier and liner layers leads to metal diffusion into dielectric layers under the conductive line trenches, which adversely affects device reliability.

In addition, reactive ion etching (ME) processes when forming trenches for structures such as, for example, source/drain contacts, gate contacts, and other contacts, may result in trenches with non-uniform depths, which causes unwanted resistance and capacitance (RC) variations. Variations in trench depth can occur, for example, between narrow and wide lines due to ME lag.

SUMMARY

According to an exemplary embodiment of the present invention, a method for manufacturing a semiconductor device includes forming an interconnect in a first dielectric layer, and forming a second dielectric layer on the first dielectric layer. In the method, an etch stop layer is formed on the second dielectric layer, and a third dielectric layer is formed on the etch stop layer. A trench and an opening are formed in the third and second dielectric layers, respectively. A barrier layer is deposited in the trench and in the opening, and on a top surface of the interconnect. The method also includes removing the barrier layer from the top surface of the interconnect and from a bottom surface of the trench, and depositing a conductive fill layer in the trench and in the opening, and on the interconnect. A bottom surface of the trench includes the etch stop layer.

According to an exemplary embodiment of the present invention, a semiconductor device includes a first interconnect disposed in a first dielectric layer, a second dielectric layer disposed on the first dielectric layer, and a third dielectric layer disposed on the second dielectric layer. A second interconnect is disposed in a trench in the third dielectric layer, and includes a first portion of a conductive fill layer. A bottom surface of the trench includes an etch stop layer including a conductive material. The etch stop layer is disposed between the first portion of the conductive fill layer and the second dielectric layer. The semiconductor device also includes a via disposed in the second dielectric layer. The via includes a second portion of the conductive fill layer, and connects the second interconnect to the first interconnect. The second portion of the conductive fill layer is disposed on the first interconnect.

According to an exemplary embodiment of the present invention, a method for manufacturing a semiconductor device includes forming an etch stop layer on a first dielectric layer, and forming a second dielectric layer on the etch stop layer. In the method, the second dielectric layer is etched down to the etch stop layer to form a trench in the second dielectric layer. A bottom surface of the trench includes the etch stop layer. The first dielectric layer is etched to form an opening in the first dielectric layer under the trench. The etching of the first dielectric layer exposes a top surface of an interconnect under the opening. The method further includes depositing a barrier layer in the trench and in the opening, and on the top surface of the interconnect. The barrier layer is removed from the top surface of the interconnect and from a bottom surface of the trench. A conductive fill layer is deposited in the trench and in the opening, and on the interconnect.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 16 is a cross-sectional view illustrating fabrication of a semiconductor device, and showing dielectric layer formation and planarization, according to an exemplary embodiment of the present invention.

DETAILED DESCRIPTION

Figure 1:
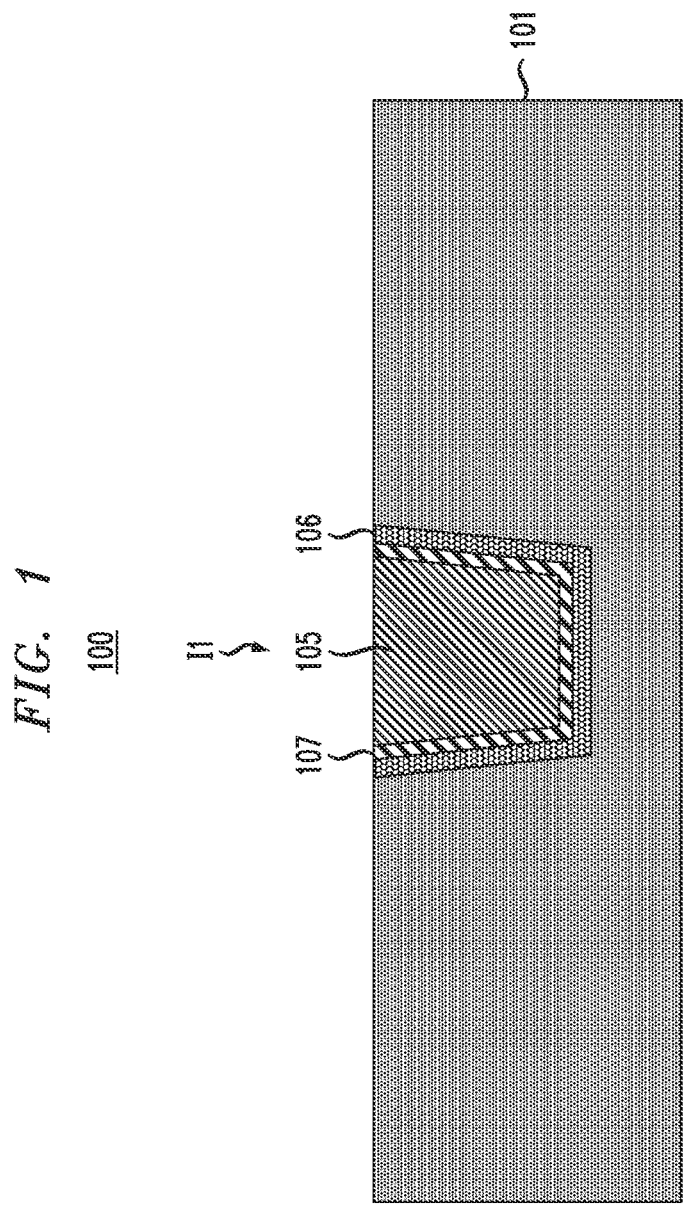
FIG. 1 is a cross-sectional view illustrating fabrication of a semiconductor device, and showing formation of a lower level metallization layer, according to an exemplary embodiment of the present invention.

Exemplary embodiments of the invention will now be discussed in further detail with regard to semiconductor devices and methods of manufacturing same and, in particular, to the use of a metallic etch stop layer as a diffusion barrier and to form trenches having a uniform depth.

It is to be understood that the various layers and/or regions shown in the accompanying drawings are not drawn to scale, and that one or more layers and/or regions of a type commonly used in, for example, complementary metal-oxide semiconductor (CMOS), fin field-effect transistor (FinFET), metal-oxide-semiconductor field-effect transistor (MOSFET), programmable logic devices (PLDs), programmable gate arrays, programmable read-only memory (PROM) devices, including, but not limited to, erasable programmable read-only memories (EPROMS), electronically erasable programmable read-only memories (EEPROMS), and/or other semiconductor devices, may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not necessarily be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, CMOSs, MOSFETs, FinFETs, PLDs, programmable gate arrays, PROMS, EPROMS, and/or EEPROMS. By way of non-limiting example, the semiconductor devices can include, but are not necessarily limited to CMOS, MOSFET, FinFET, PLD, programmable gate array, PROM, EPROM, and/or EEPROM devices, and/or semiconductor devices that use CMOS, MOSFET, FinFET, PLD, programmable gate array, PROM, EPROM, and/or EEPROM technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surfaces of the dielectric layers in the cross-sectional views, and "horizontal" refers to a direction parallel to the top surfaces of the dielectric layers in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, "low-k" refers to dielectric materials having a relative dielectric constant less than 7, and includes ultra-low-k dielectric materials.

As used herein, "high-k" refers to dielectric materials having a relative dielectric constant greater than 7.

There is a need for via and metallization layer structures and methods of manufacturing same which allow for the elimination of barrier and liner layers at bottom portions of vias connecting contact structures, while maintaining a diffusion barrier at bottom portions of the contact structures. In accordance with the embodiments, a metallic etch stop layer functions as a diffusion barrier at the bottom of contact trenches, and is used during manufacturing to form trenches with uniform depths. As a result, via resistance is lowered without any concerns of contact metal diffusion into underlying dielectric layers. In addition, the embodiments result in the same trench depth regardless of trench width, while preventing unwanted RC variability. The embodiments provide contact structures which avoid non-uniformity between trenches and provides the low resistance benefits of barrier and liner layer removal from vias without unwanted metal diffusion into dielectric layers under conductive line trenches.

Referring to FIG. 1, a semiconductor device 100 includes an interconnect I1 formed in a first dielectric layer 101. The interconnect I1 includes a barrier layer 106 and liner layer 107 formed on the barrier layer 106. A fill layer 105 is formed on the liner layer 107. The barrier layer 106 includes, for example, titanium nitride, tantalum nitride or tungsten nitride and is conformally formed on sidewalls and a bottom surface of a trench in the first dielectric layer 101. The liner layer 107 includes, for example, cobalt and/or ruthenium and is conformally formed on the barrier layer 106. The fill layer 105 includes, an electrically conductive metal, such as, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof. The interconnect I1 and the first dielectric layer 101 can form at least part of a lower metallization level ($M_x$).

Interconnects, also referred to herein as wires or conductive lines, function as conductive contacts. Interconnects form electrical connections between elements and/or devices, or form contacts to elements or devices. As used herein, an "interconnect" or "interconnect structure" includes a conductive fill layer, and may further include a barrier layer and/or a liner layer.

The first dielectric layer 101 includes, for example, silicon dioxide ($SiO_2$), carbon-doped silicon oxide (SiCOH), SiLK® dielectrics, porous forms of these low-k dielectric films, flowable dielectrics and/or spin-on dielectrics. As can be understood by one of ordinary skill in the art, the dielectric layer 101 can be on a semiconductor substrate (not shown), with intervening layers (e.g., lower conductive lines, devices, etc.) between the dielectric layer 101 and the substrate. A semiconductor substrate may comprise semiconductor material including, but not limited to, Si, SiGe, SiC, SiGeC or other like semiconductor. In addition, multiple layers of the semiconductor materials can be used as the semiconductor material of the substrate. A plurality of devices can be on the substrate, such as, for example, transistors, capacitors, and resistors.

Figure 2:
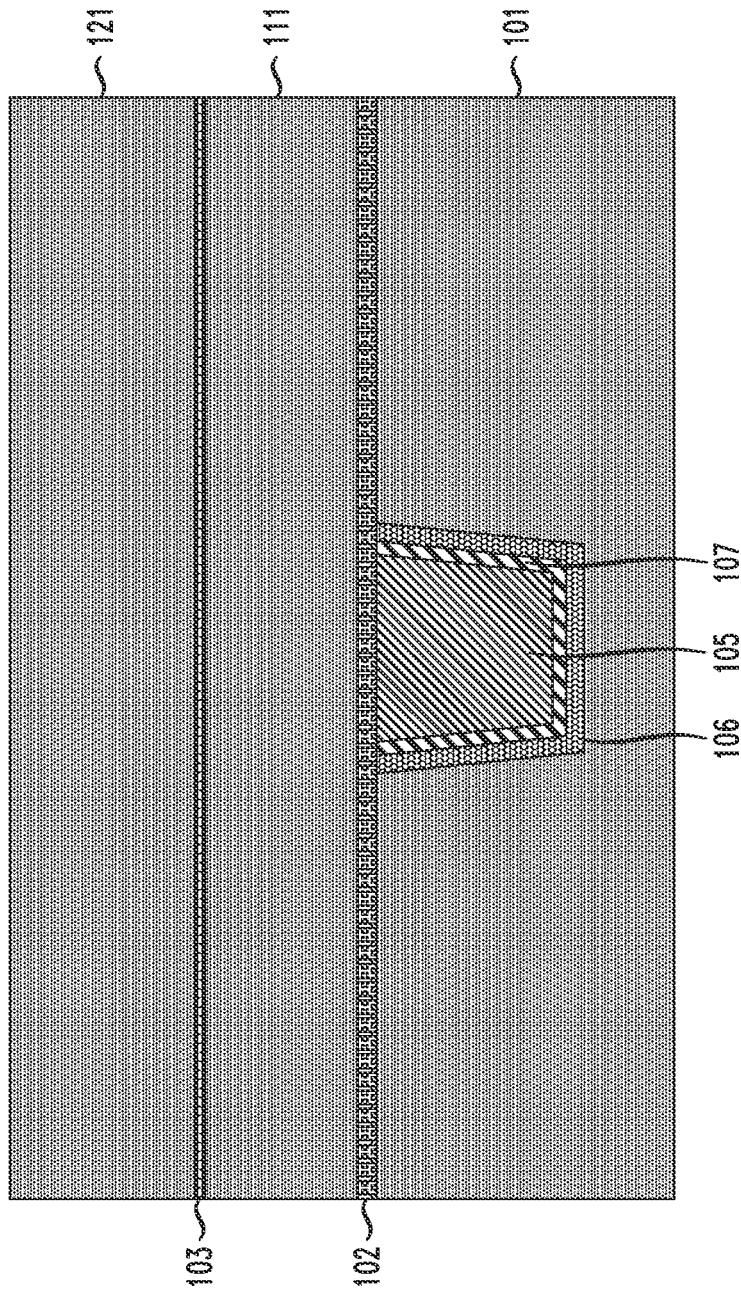
FIG. 2 is a cross-sectional view illustrating fabrication of a semiconductor device, and showing cap layer, dielectric layer and etch stop layer formation, according to an exemplary embodiment of the present invention.

Referring to FIG. 2, a dielectric capping layer 102 comprising, for example, NBLoK™ material or a nitride material (e.g., silicon carbonitride (SiCN)), is formed on the first dielectric layer 101. NBLoK™ material is from Applied Materials, Inc. of Santa Clara, Calif., and is a nitrogen-doped silicon carbide. As can be seen, the capping layer 102 is deposited on top surfaces of the dielectric layer 101 and the interconnect I1.

A second dielectric layer 111 is formed on the dielectric capping layer 102, and comprises, for example, the same material as or a similar material to the first dielectric layer 101. The second dielectric layer 111 is deposited using one or more deposition techniques, such as, but not necessarily limited to, physical vapor deposition (PVD), chemical vapor deposition (CVD), atomic layer deposition (ALD), plasma-enhanced CVD (PECVD), radio frequency CVD (RFCVD), molecular layer deposition (MLD), molecular beam deposition (MBD), liquid source misted chemical deposition (LSMCD) and/or sputtering.

An etch stop layer 103 is deposited on the second dielectric layer 111. The etch stop layer 103 includes for example, an electrically conductive metal material such as, but not necessarily limited to, tantalum (Ta), tantalum nitride (TaN), Ta/TaN, Ta/Ruthenium (Ru), Ta/Cobalt (Co), TaN/Ru, TaN/Co, Ta/TaN/Ru, and/or Ta/TaN/Co. The etch stop layer 103 is deposited using deposition techniques such as, but not necessarily limited to, PVD, CVD, ALD, PECVD, RFCVD, MLD, MBD, LSMCD, and/or sputtering.

A third dielectric layer 121 is deposited on the etch stop layer 103. According to an embodiment, the third dielectric layer 121 comprises the same or similar material as that of the first and second dielectric layers 101 and 111, as long as the third dielectric layer 121 is able to be selectively etched with respect to the etch stop layer 103. The third dielectric layer 121 is deposited using, for example, PVD, CVD, ALD, PECVD, RFCVD, MLD, MBD, LSMCD, and/or sputtering. The etch stop layer 103 permits complete removal of the third dielectric layer 121 down to the etch stop layer 103, which permits formation of trenches in the dielectric layer 121, each having bottom surfaces level with each other such that the trenches have the same depth.

Figure 3:
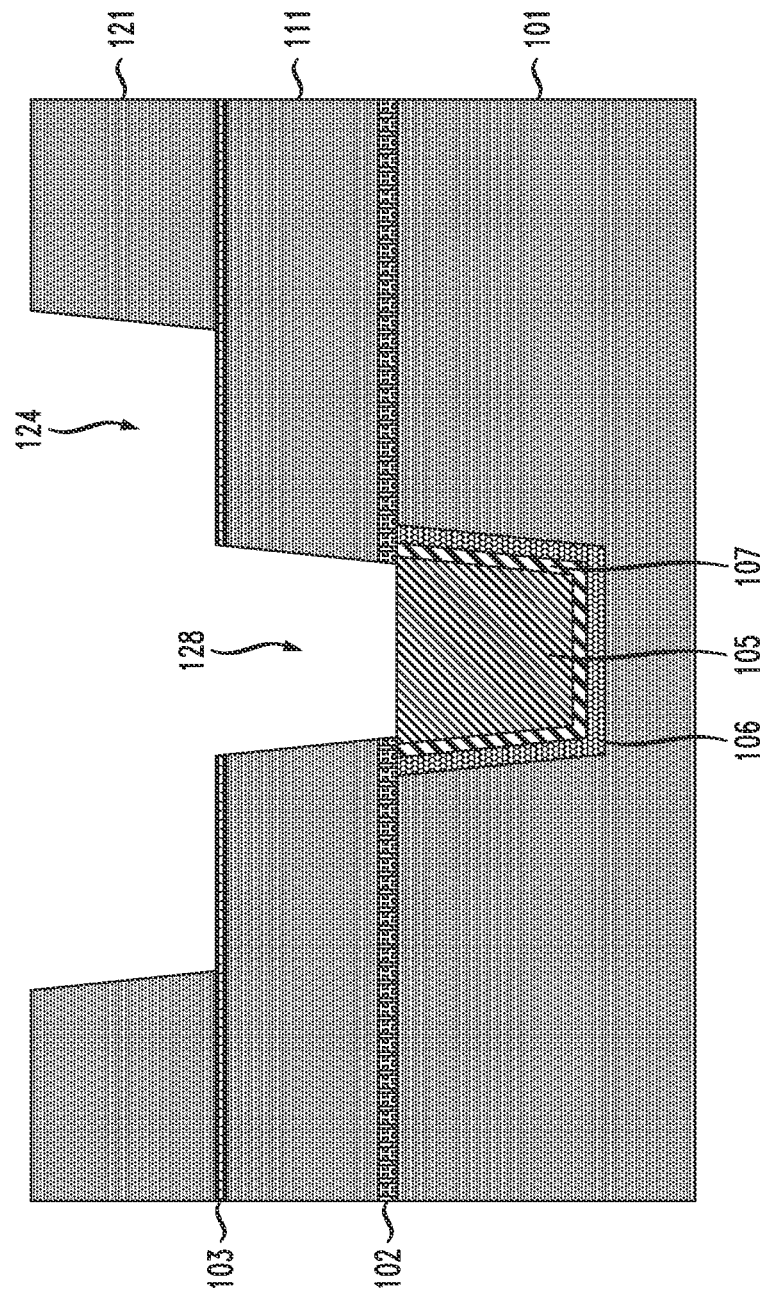
FIG. 3 is a cross-sectional view illustrating fabrication of a semiconductor device, and showing upper level metallization trench and via opening formation, according to an exemplary embodiment of the present invention.

Referring to FIG. 3, portions of the third dielectric layer 121 (e.g., portions not covered by a mask) are etched down to the etch stop layer 103 to form an upper metallization level trench 124. Since the etch stop layer 103 is not etched by the etchant used to remove the dielectric layer 121 or, at the very least, is etched at a very slow rate with respect to that of the dielectric layer 121, the exposed portion of the dielectric layer 121 can be completely removed to form the trench 124. For example, a representative selectivity ratio of the etch rate of the dielectric layer 121 with respect to that of the etch stop layer 103 would be approximately 5:1. Due to the etch stop layer 103, all trenches formed in the dielectric layer 121 can have a uniform depth. According to an embodiment, the etching is performed using, for example, a fluorocarbon based dry etch process or an ultra-violet (UV) damage and wet etch process.

A via opening 128 under the trench 124 is formed in the dielectric layer 111. The via opening 128 is formed by removing a portion of the etch stop layer 103 and removing a portion of the dielectric layer 111 and the capping layer 102. The portion of the etch stop layer 103 is removed using, for example, an etch process with chlorine-based plasma or fluorine-based plasma, and the portion of the capping layer 102 is removed using, for example, an etch process with fluorine-based plasma. Etching of the dielectric layer 111 is performed using, for example, a process similar to that to remove the dielectric layer 121. As shown in FIG. 3, the via opening 128 exposes a top surface of the fill layer 105. The via opening may also expose top surfaces of the barrier and/or liner layers 106 and 107.

Figure 4:
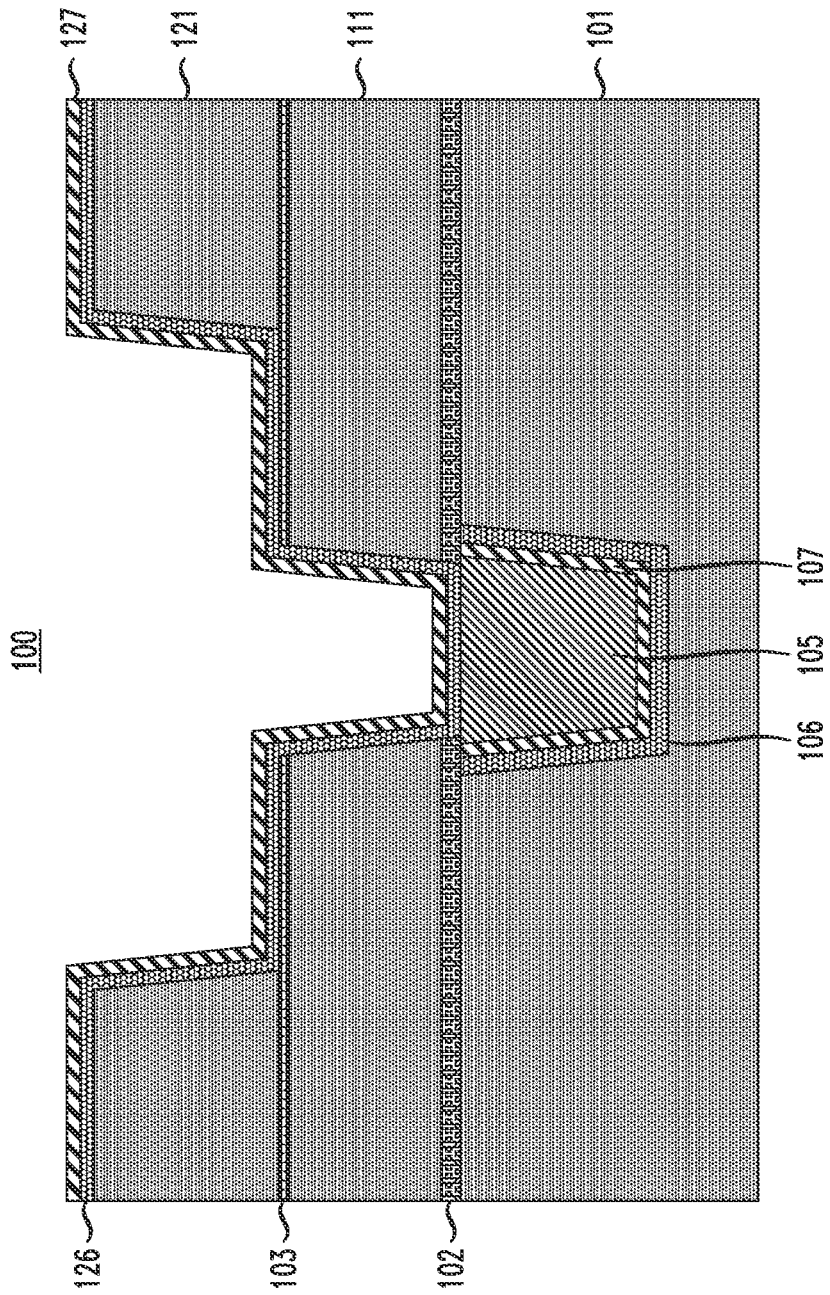
FIG. 4 is a cross-sectional view illustrating fabrication of a semiconductor, and showing formation of barrier and liner layers, according to an exemplary embodiment of the present invention.

Referring to FIG. 4, the trench 124 and opening 128 are lined with barrier and liner layers 126 and 127 the same as or similar to barrier and liner layers 106 and 107. For example, the barrier and liner layers 126 and 127 can have the same material as or similar material to the barrier and liner layers 106 and 107.

The barrier and liner layers 126 and 127 are conformally or non-conformally formed on a top surface of the dielectric layer 121, and on sidewalls and bottom surfaces of the trench 124 and opening 128, including exposed surfaces of the capping layer 102, etch stop layer 103 and dielectric layers 121 and 111, and on the exposed top surfaces of the interconnect I1 (e.g., on fill layer 105). The barrier and liner layers 126 and 127 are deposited using, for example, a deposition technique, such as ALD, CVD or PVD.

Figure 5:
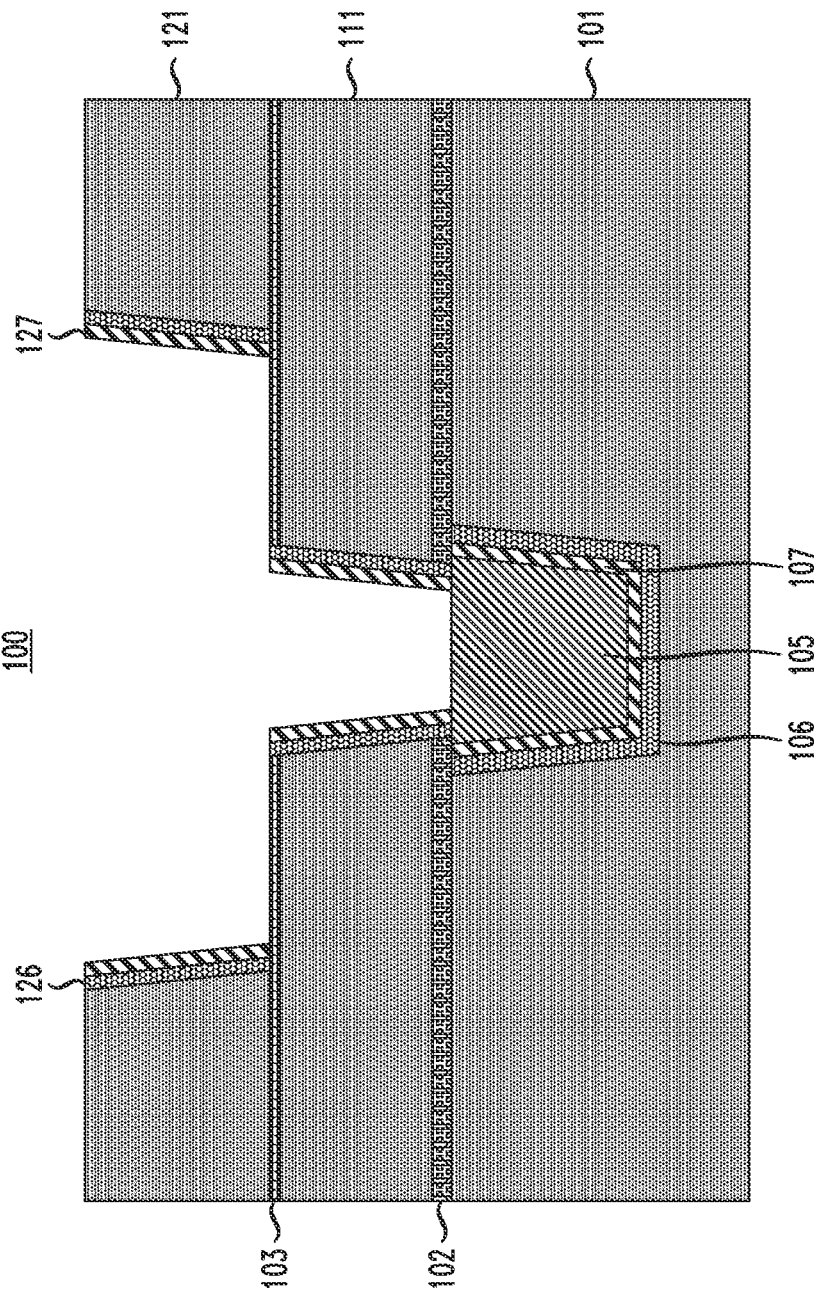
FIG. 5 is a cross-sectional view illustrating fabrication of a semiconductor device, and showing barrier and liner layer etch back, according to an exemplary embodiment of the present invention.

Referring to FIG. 5, horizontal portions of the barrier and liner layers 126 and 127 are removed in an etch back process. The etch back process can be performed using, for example, a directional dry etch process comprising argon sputtering. The etch back process removes portions of the barrier and liner layers 126 and 127 from top surfaces of the dielectric layer 121, the top surface of the etch stop layer 103 on the dielectric layer 111, and the from top surface of the interconnect I1, including the fill layer 105, exposing a top surface of the fill layer 105. Although the barrier and liner layers 126 and 127 are removed from the top surface of the etch stop layer 103 on the dielectric layer 111, the etch stop layer 103, which is formed of a metallic material, remains. As a result, once a conductive fill layer (e.g., layer 125) is deposited in the trench 124 on the etch stop layer 103, the metallic etch stop layer 103 can be a diffusion barrier to prevent diffusion of the material of fill layer (e.g., layer 125) into the dielectric layer 111.

Figure 6:
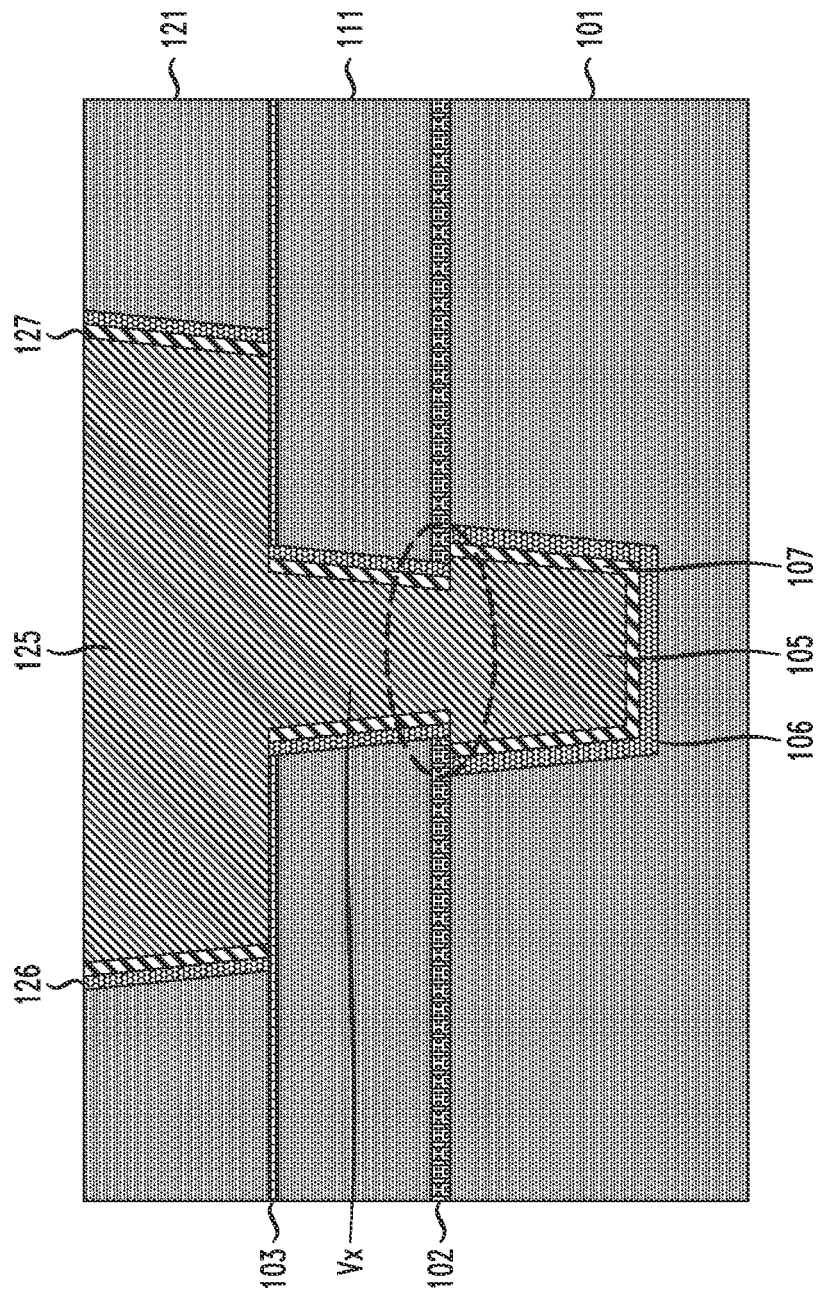
FIG. 6 is a cross-sectional view illustrating fabrication of a semiconductor, and showing formation of a conductive fill layer, according to an exemplary embodiment of the present invention.

Referring to FIG. 6, the remaining portions of the trench 124 and opening 128 are filled with conductive fill layer 125, similar to fill layer 105. For example, the fill layer 125 can have the same material as or similar material to the fill layer 105. The fill layer 125 is deposited on the exposed portions of the barrier and liner layers 126 and 127, as well as on the exposed portions of the etch stop layer 103 and the interconnect I1, including fill layer 105. The fill layer 125 is deposited using deposition techniques, including, but not necessarily limited to, PVD, CVD, ALD or sputtering.

Following deposition of the fill layer 125, a planarization process, such as, for example, CMP, is performed to remove portions of the fill layer 125 on the top surface of the dielectric layer 121 and extending out of the trench 124 to planarize an upper surface of the device.

The circled portion in FIG. 6 illustrates the lack of a barrier layer and a liner layer at the bottom of the via $V_x$, where the fill layer 125 is deposited directly on the fill layer 105, with no intervening barrier or liner layer. The removal of the liner and barrier layers from the bottom of the via $V_x$ lowers the resistance as compared to when the liner and barrier layers are present, thereby improving device performance. In a non-limiting example, eliminating TaN and Co barrier and liner layers at a bottom surface of a Cu via having a critical dimension of about 5 nm reduces via resistance by about 85%, which may translate to about a 35% reduction in stage resistance for a 3-input NAND gate, and about a 12% increase in frequency at isopower for an inverter with a 3-way fanout.

Figure 7:
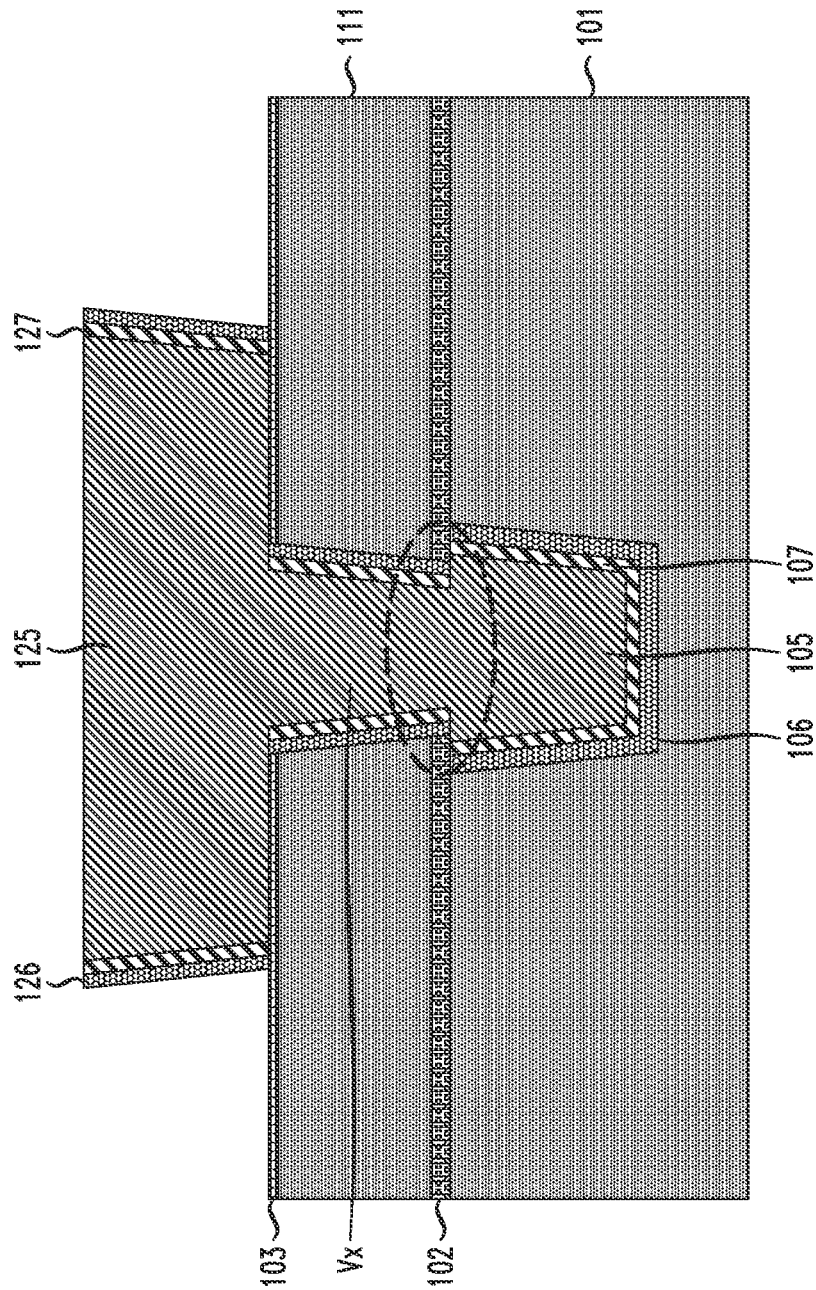
FIG. 7 is a cross-sectional view illustrating fabrication of a semiconductor device, and showing dielectric layer removal, according to an exemplary embodiment of the present invention.
Figure 8:
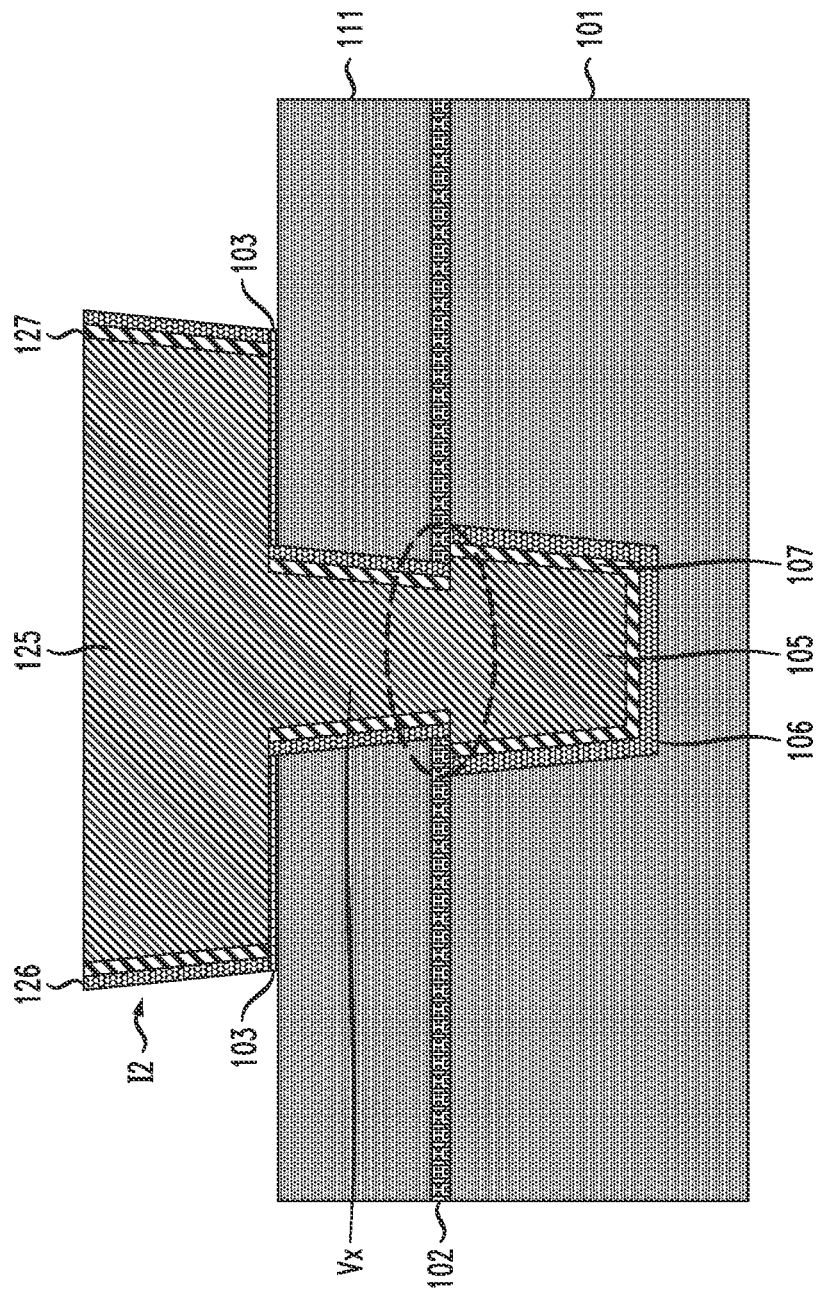
FIG. 8 is a cross-sectional view illustrating fabrication of a semiconductor device, and showing removal of exposed portions of the etch stop layer, according to an exemplary embodiment of the present invention.

Referring to FIG. 7, remaining portions of the dielectric layer 121 are removed using the same or a similar etch process as that described in connection with the removal of portions of the dielectric layer 121 to form the trench 124. The removal of the remaining portions of the dielectric layer 121 exposes portions of the etch stop layer 103 that were under the dielectric layer 121. Referring to FIG. 8, exposed portions of the etch stop layer 103 are removed using, for example, a chlorine-based plasma or fluorine-based plasma. The portions of the etch stop layer 103 under the interconnect structure 12 are not removed. There is no capacitance penalty by removing the exposed portions of the etch stop layer 103.

Figure 9:
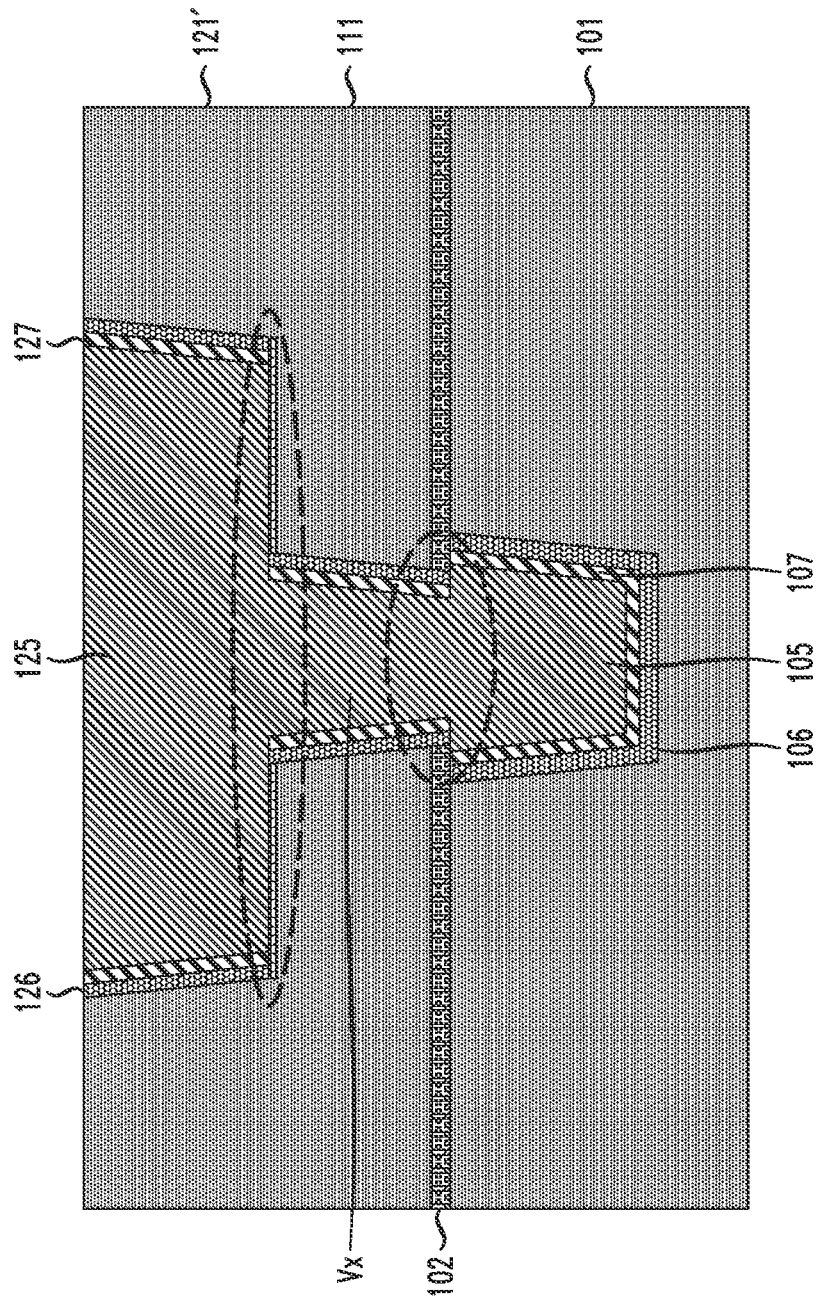
FIG. 9 is a cross-sectional view illustrating fabrication of a semiconductor device, and showing dielectric layer formation and planarization, according to an exemplary embodiment of the present invention.

Referring to FIG. 9, a dielectric layer 121' is formed on the dielectric layer 111 to replace the removed dielectric layer 121 and fills in gaps around the interconnect structure 12 and the remaining portions of the etch stop layer 103. According to an embodiment, the dielectric layer 121' comprises the same or similar material as that of the dielectric layers 101, 111 and 121. The dielectric layer 121' is deposited using, for example, PVD, CVD, ALD, PECVD, RFCVD, MLD, MBD, LSMCD, and/or sputtering, followed by a planarization, such as, for example, CMP to planarize the dielectric layer 121' with the interconnect structure 12.

As shown by the top circled portion in FIG. 9, the etch stop layer 103 between the bottom surface of the fill layer in trench 124 and the dielectric layer 111 prevents the material of the conductive fill layer 125 from diffusing into the dielectric layer 111. In addition, the trench 124 has a uniform depth measured from a top surface of the fill layer 125 to the top surface of the etch stop layer 103. Like in FIGS. 6-8, the bottom circled portion in FIG. 9 illustrates the lack of a barrier layer and a liner layer at the bottom of the via $V_x$, where the fill layer 125 is deposited directly on the fill layer 105. The lack of the liner and barrier layers at the bottom of the via $V_x$ lowers the resistance as compared to when the liner and barrier layers are present, thereby improving device performance. The interconnect 12 surrounded by the dielectric layer 121' and the dielectric layer 121' can form at least part of an upper metallization level ($M_{x+1}$).

Figure 10:
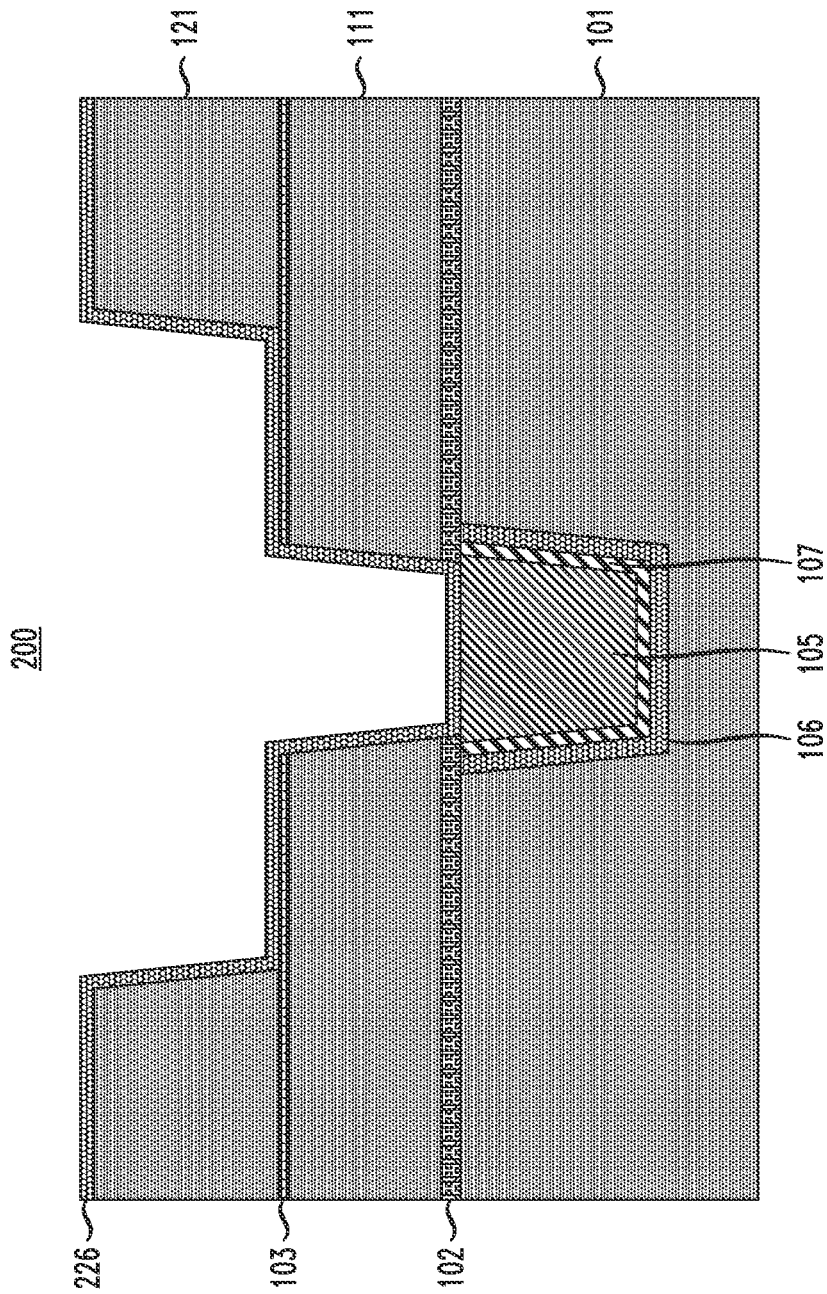
FIG. 10 is a cross-sectional view illustrating fabrication of a semiconductor device, and showing formation of barrier layer, according to an exemplary embodiment of the present invention.

Referring to FIG. 10, following the processing from FIG. 3, in a semiconductor device 200, the trench 124 and opening 128 are lined with a barrier layer 226. The barrier layer 226 can have the same material as or similar material to the barrier layer 126, and can be deposited using, for example, a deposition technique, such as ALD, CVD or PVD. The barrier layer 226 is conformally or non-conformally formed on a top surface of the dielectric layer 121, and on sidewalls and bottom surfaces of the trench 124 and opening 128, including exposed surfaces of the capping layer 102, etch stop layer 103 and dielectric layers 121 and 111, and on the exposed top surfaces of the interconnect I1 (e.g., on fill layer 105).

Figure 11:
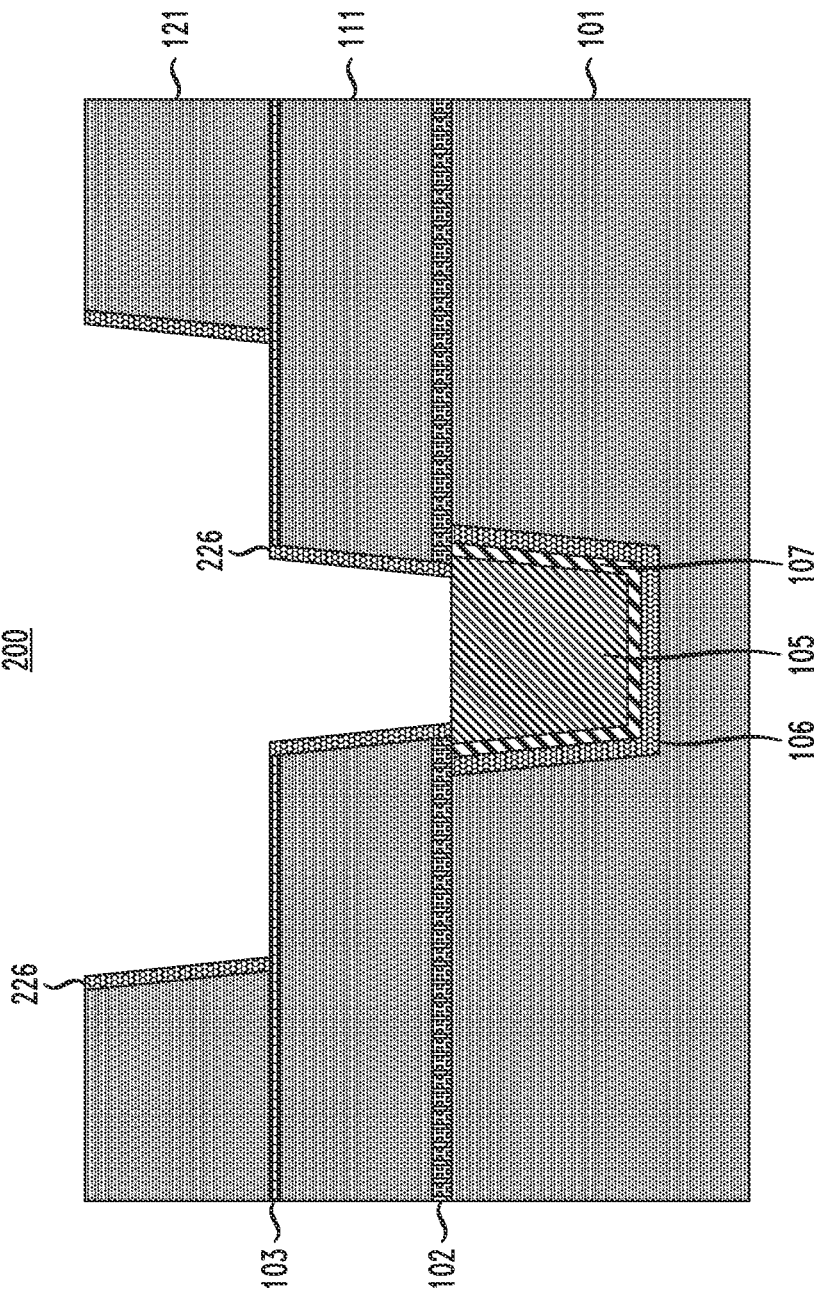
FIG. 11 is a cross-sectional view illustrating fabrication of a semiconductor device, and showing barrier layer etch back, according to an exemplary embodiment of the present invention.

Referring to FIG. 11, horizontal portions of the barrier layer 226 are removed in an etch back process. The etch back process can be performed using, for example, a directional dry etch process comprising argon sputtering. The etch back process removes portions of the barrier layer 226 from top surfaces of the dielectric layer 121, the top surface of the etch stop layer 103 on the dielectric layer 111, and the from top surface of the interconnect I1, including the fill layer 105. Although the barrier layer 226 is removed from the top surface of the etch stop layer 103 on the dielectric layer 111, the etch stop layer 103, which is formed of a metallic material, remains. As a result, once a conductive fill layer (e.g., layer 225) is deposited in the trench 124 on the etch stop layer 103, the metallic etch stop layer 103 can be a diffusion barrier to prevent diffusion of the material of fill layer (e.g., layer 125) into the dielectric layer 111.

Figure 12:
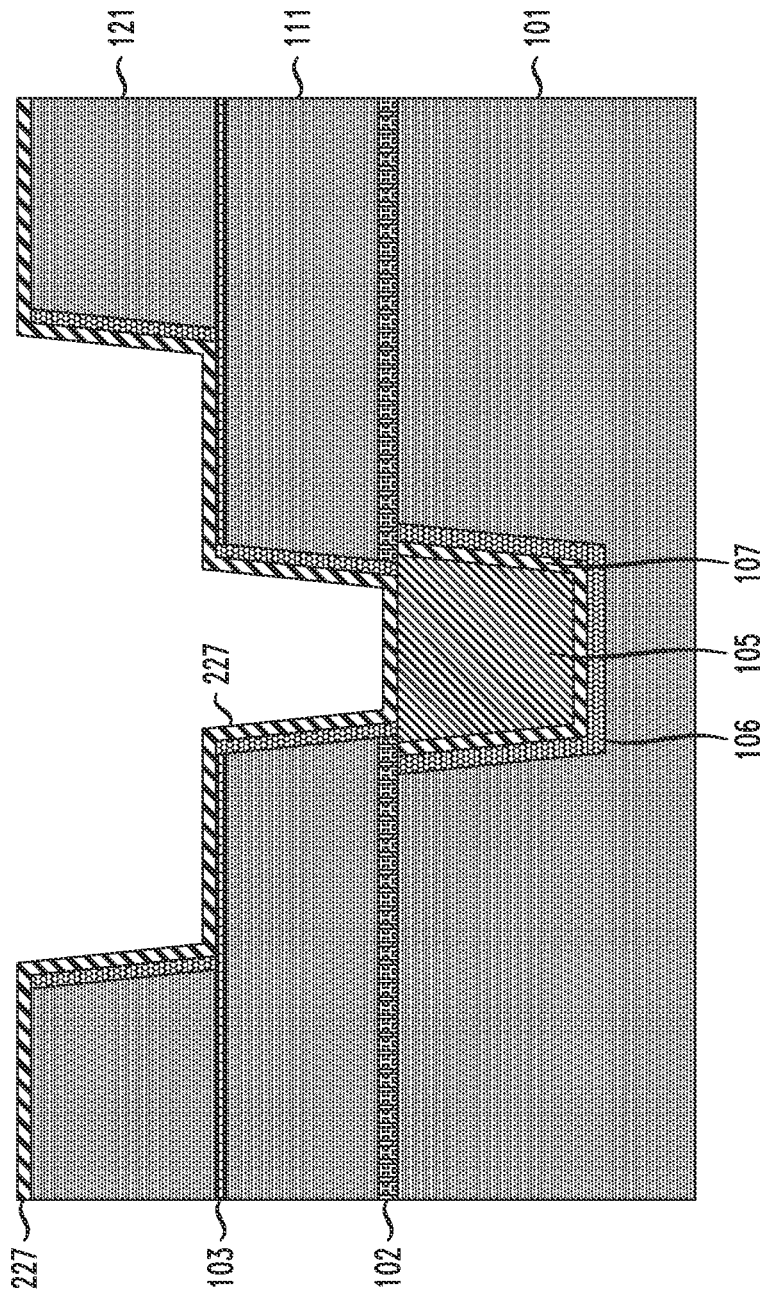
FIG. 12 is a cross-sectional view illustrating fabrication of a semiconductor device, and showing formation of a liner layer, according to an exemplary embodiment of the present invention.

Referring to FIG. 12, a liner layer 227 is deposited on the barrier layer 226, on the etch stop layer 103 and on the top surface of the interconnect I1 (e.g., on the fill layer 105). The liner layer 227 is also deposited on the exposed top surface of the dielectric layer 121. The liner layer 227 can have the same material as or similar material to the liner layer 127, and can be deposited using, for example, a conformal deposition technique, such as ALD or CVD.

Figure 13:
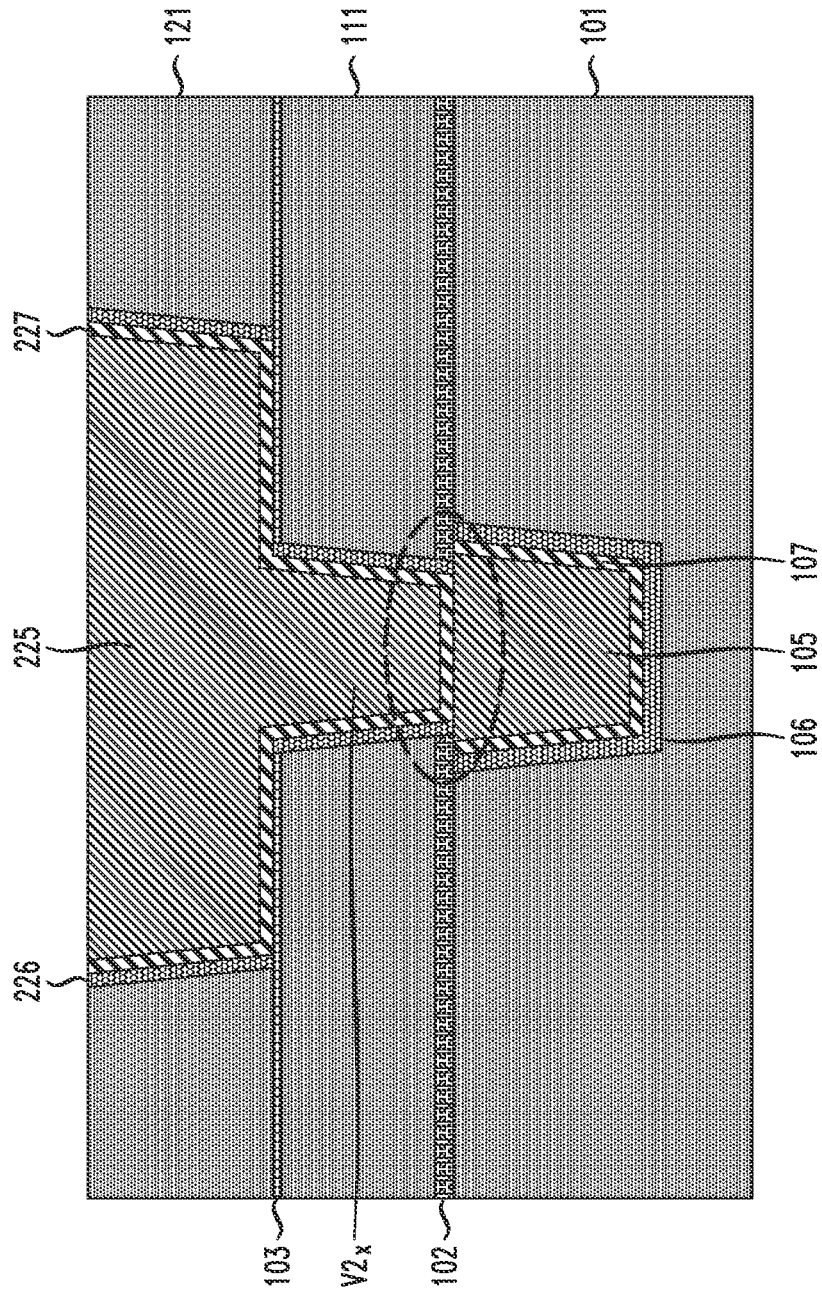
FIG. 13 is a cross-sectional view illustrating fabrication of a semiconductor, and showing formation of a conductive fill layer, according to an exemplary embodiment of the present invention.

Referring to FIG. 13, the remaining portions of the trench 124 and opening 128 are filled with conductive fill layer 225, similar to fill layer 125. For example, the fill layer 225 can have the same material as or similar material to the fill layer 125. The fill layer 225 is deposited on an exposed surface of the liner layer 227 using deposition techniques, including, but not necessarily limited to, PVD, CVD, ALD or sputtering.

Following deposition of the fill layer 225, a planarization process, such as, for example, CMP, is performed to remove portions of the fill and liner layers 225 and 227 on the top surface of the dielectric layer 121 and extending out of the trench 124 to planarize an upper surface of the device.

The circled portion in FIG. 13 illustrates the lack of a barrier layer at the bottom of the via $V2_x$, where the fill layer 225 is deposited directly on the liner layer 227. Even with the presence of the liner layer 227, the removal of barrier layer from the bottom of the via $V2_x$ lowers the resistance as compared to when the barrier layer is present, thereby improving device performance.

Figure 14:
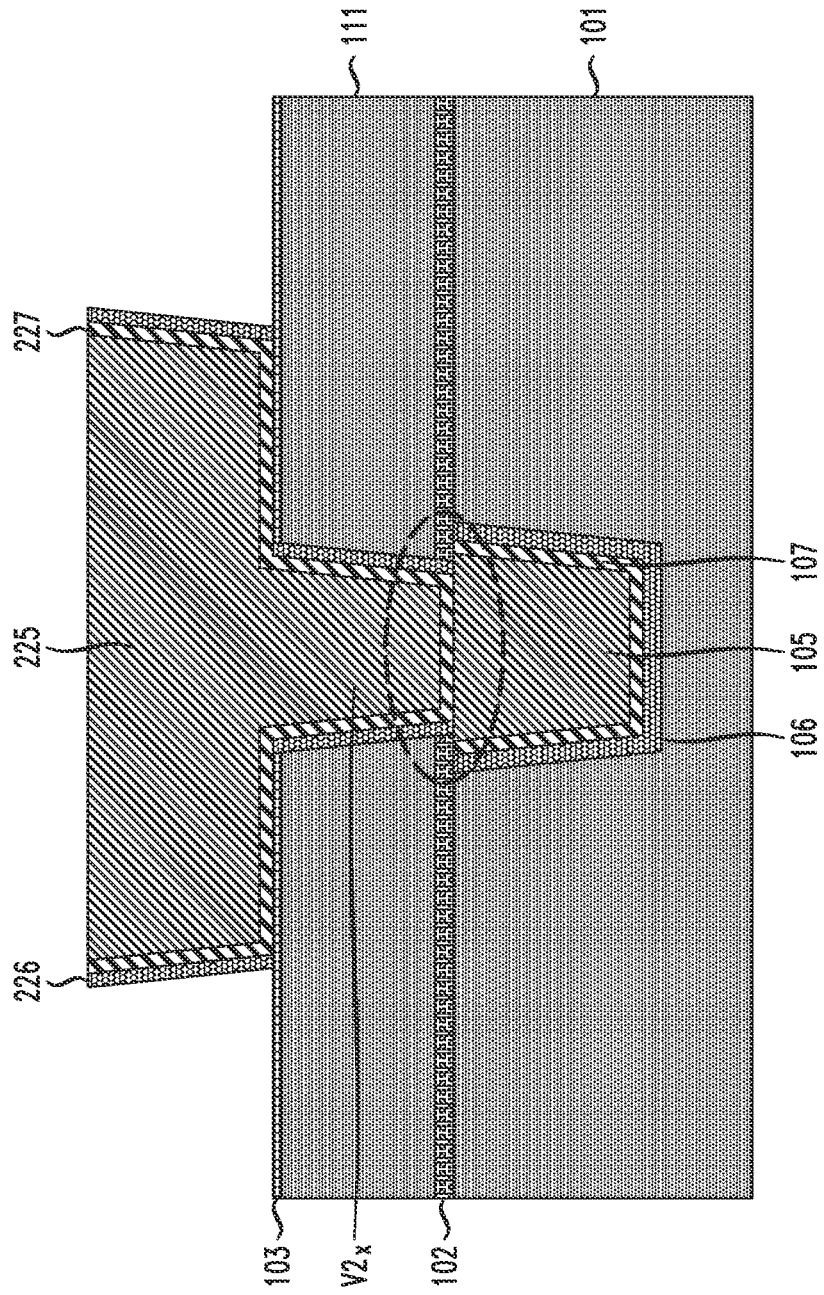
FIG. 14 is a cross-sectional view illustrating fabrication of a semiconductor device, and showing dielectric layer removal, according to an exemplary embodiment of the present invention.
Figure 15:
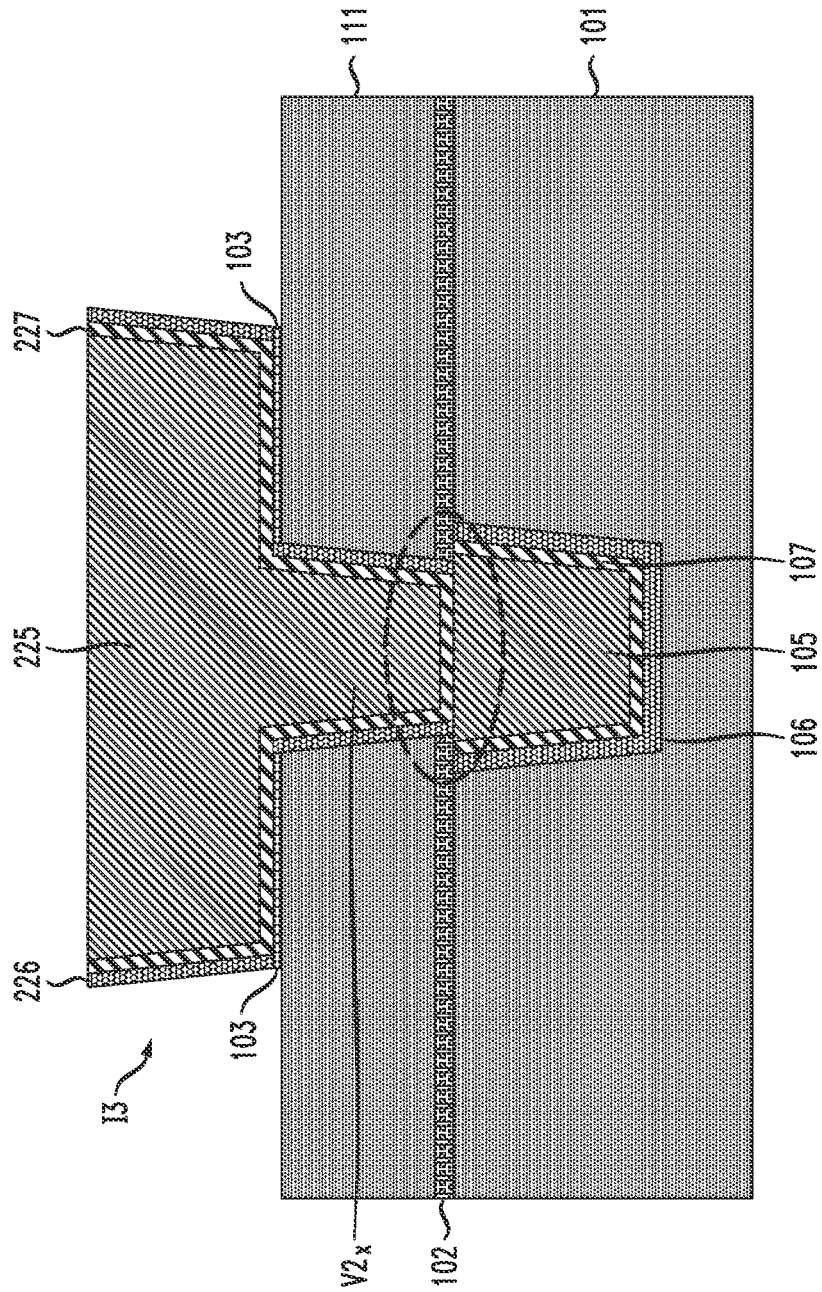
FIG. 15 is a cross-sectional view illustrating fabrication of a semiconductor device, and showing removal of exposed portions of the etch stop layer, according to an exemplary embodiment of the present invention.

Referring to FIG. 14, following the same or similar processing to that described in connection with FIG. 7, remaining portions of the dielectric layer 121 are removed, which exposes portions of the etch stop layer 103 that were under the dielectric layer 121. Referring to FIG. 15, following the same or similar processing to that described in connection with FIG. 8, the exposed portions of the etch stop layer 103 are removed. The portions of the etch stop layer 103 under the interconnect structure 13 are not removed. There is no capacitance penalty by removing the exposed portions of the etch stop layer 103.

Referring to FIG. 16, following the same or similar processing to that described in connection with FIG. 9, a dielectric layer 221 is formed on the dielectric layer 111 to replace the removed dielectric layer 121 and fills in gaps around the interconnect structure 13 and the remaining portions of the etch stop layer 103. According to an embodiment, the dielectric layer 221 comprises the same or similar material as that of the dielectric layers 101, 111 and 121. The dielectric layer 221 is deposited using, for example, PVD, CVD, ALD, PECVD, RFCVD, MLD, MBD, LSMCD, and/or sputtering, followed by a planarization, such as, for example, CMP to planarize the dielectric layer 221 with the interconnect structure 13.

As shown by the top circled portion in FIG. 16, the etch stop layer 103 between the bottom surface of the liner layer 227 in trench 124 and the dielectric layer 111 prevents the material of the conductive fill layer 225 from diffusing into the dielectric layer 111. In addition, the trench 124 has a uniform depth measured from a top surface of the fill layer 225 to the top surface of the etch stop layer 103. Like in FIGS. 13-15, the bottom circled portion in FIG. 16 illustrates the lack of a barrier layer, and only the liner layer 227 at the bottom of the via $V2_x$, where the liner layer 227 is deposited directly on the fill layer 105 with no intervening barrier layer, and the fill layer 225 is deposited directly on the liner layer 227. The lack of the barrier layer at the bottom of the via $V_x$ lowers the resistance as compared to when the barrier layer is present, thereby improving device performance. The interconnect 13 surrounded by the dielectric layer 221 and the dielectric layer 221 can form at least part of an upper metallization level ($M_{x+1}$).

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
   forming an interconnect in a first dielectric layer;
   forming a second dielectric layer on the first dielectric layer;
   forming an etch stop layer on the second dielectric layer;
   forming a third dielectric layer on the etch stop layer;
   forming a trench in the third dielectric layer;
   forming an opening in the second dielectric layer;
   depositing a barrier layer in the trench and the opening and on a top surface of the interconnect;
   removing the barrier layer from the top surface of the interconnect and from a bottom surface of the trench;
   depositing a conductive fill layer in the trench and in the opening and on the interconnect;
   wherein a bottom surface of the trench comprises the etch stop layer; and
   removing the third dielectric layer following the depositing of the conductive fill layer, wherein the removing of the third dielectric layer exposes portions of the etch stop layer.

2. The method according to claim 1, wherein the conductive fill layer is deposited on the top surface of the interconnect.

3. The method according to claim 1, wherein the conductive fill layer is deposited on the etch stop layer.

4. The method according to claim 3, wherein the etch stop layer comprises a conductive material.

5. The method according to claim 4, wherein the etch stop layer comprises one of tantalum (Ta), tantalum nitride (TaN), Ta/TaN, Ta/Ruthenium (Ru), Ta/Cobalt (Co), TaN/Ru, TaN/Co, Ta/TaN/Ru, and Ta/TaN/Co.

6. The method according to claim 1, wherein:
   the conductive fill layer in the trench forms at least part of a second interconnect; and
   the conductive fill layer in the opening forms at least part of a via connecting the second interconnect to the interconnect.

7. The method according to claim 1, further comprising:
   removing the exposed portions of the etch stop layer; and
   depositing a fourth dielectric layer in place of the removed third dielectric layer.

8. The method according to claim 1, wherein following the removing of the barrier layer, portions of the barrier layer remain on side surfaces of the trench and the opening.

9. The method according to claim 1, further comprising depositing a liner layer on the barrier layer in the trench and in the opening and on the top surface of the interconnect.

10. The method according to claim 9, further comprising removing the liner layer from the top surface of the interconnect and from the bottom surface of the trench.

11. The method according to claim 1, further comprising depositing a liner layer in the trench and in the opening and on the interconnect after the removing of the barrier layer from the top surface of the interconnect and from the bottom surface of the trench.

12. The method according to claim 11, wherein the liner layer is deposited on remaining portions of the barrier layer formed on side surfaces of the trench and of the opening.

13. The method according to claim 11, wherein the liner layer is deposited on the top surface of the interconnect.

14. The method according to claim 13, wherein the conductive fill layer is deposited on the liner layer.

15. A method for manufacturing a semiconductor device, comprising:
   forming an etch stop layer on a first dielectric layer;
   forming a second dielectric layer on the etch stop layer;
   etching the second dielectric layer down to the etch stop layer to form a trench in the second dielectric layer, wherein a bottom surface of the trench comprises the etch stop layer;
   etching the first dielectric layer to form an opening in the first dielectric layer under the trench, wherein the etching of the first dielectric layer exposes a top surface of an interconnect under the opening;

depositing a barrier layer in the trench and in the opening and on the top surface of the interconnect;

removing the barrier layer from the top surface of the interconnect and from a bottom surface of the trench;

depositing a conductive fill layer in the trench and in the opening and on the interconnect; and removing the second dielectric layer following the depositing of the conductive fill layer, wherein the removing of the second dielectric layer exposes portions of the etch stop layer.

16. The method according to claim 15, wherein the conductive fill layer is deposited on the top surface of the interconnect.

17. The method according to claim 15, wherein the conductive fill layer is deposited on the etch stop layer.

18. The method according to claim 17, wherein the etch stop layer comprises a conductive material.

19. The method according to claim 15, wherein:
the conductive fill layer in the trench forms at least part of a second interconnect; and
the conductive fill layer in the opening forms at least part of a via connecting the second interconnect to the interconnect.

20. The method according to claim 15, further comprising:
removing the exposed portions of the etch stop layer; and
depositing a third dielectric layer in place of the removed second dielectric layer.

\* \* \* \* \*